(12) United States Patent
Namba et al.

(10) Patent No.: US 8,285,524 B2
(45) Date of Patent: Oct. 9, 2012

(54) SIMULATION METHOD FOR TRANSISTOR UNSUITABLE FOR EXISTING MODEL

(75) Inventors: Yasuhiro Namba, Tokyo (JP); Peter Lee, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 313 days.

(21) Appl. No.: 12/608,551

(22) Filed: Oct. 29, 2009

(65) Prior Publication Data

US 2010/0114543 A1   May 6, 2010

(30) Foreign Application Priority Data

Oct. 31, 2008   (JP) .................................. 2008-281435

(51) Int. Cl.
*G06F 17/50* (2006.01)

(52) U.S. Cl. ................ 703/2; 703/13; 703/14; 324/719; 716/114; 716/115

(58) Field of Classification Search ................ 703/2, 13, 703/14; 324/719; 716/114, 715
See application file for complete search history.

(56) References Cited

U.S. PATENT DOCUMENTS

| | | | |
|---|---|---|---|
| 6,524,972 B1* | 2/2003 | Maeda | 438/778 |
| 6,587,994 B1* | 7/2003 | Yamaji | 716/115 |
| 6,963,215 B1* | 11/2005 | Mastrapasqua | 324/762.09 |
| 2003/0073256 A1* | 4/2003 | Tanimoto et al. | 438/14 |
| 2006/0049842 A1* | 3/2006 | Krishnan et al. | 324/765 |
| 2006/0076971 A1* | 4/2006 | Krishnan et al. | 324/765 |
| 2009/0299716 A1* | 12/2009 | Liu et al. | 703/13 |

FOREIGN PATENT DOCUMENTS

JP   2003-188184   7/2003

* cited by examiner

*Primary Examiner* — Thai Phan
(74) *Attorney, Agent, or Firm* — McDermott Will & Emery LLP

(57) ABSTRACT

A simulation method includes determining a relationship between stress time and a degradation rate of drain current on a basis of a table in which data of a lifetime of a transistor, or the degradation rate of the transistor, is written, and calculating an amount of change in drain current accordance with the degradation rate, using a table in which information indicating a change in the drain current, being dependent on voltage, is written, based on actually measured data of drain current of the transistor after degradation, drain current in an initial state of a particular transistor model, and the relationship between stress time and the degradation rate of drain current.

9 Claims, 6 Drawing Sheets

US 8,285,524 B2

SIMULATION METHOD FOR TRANSISTOR UNSUITABLE FOR EXISTING MODEL

This application is based upon and claims the benefit of priority from Japanese Patent Application No. 2008-281435 filed on Oct. 31, 2008, the content of which is incorporated by reference.

BACKGROUND OF THE INVENTION

1. Field of the Invention

The present invention relates to a simulation method for estimating I-V characteristic change due to transistor degradation, such as hot carrier and NBTI (Negative Bias Temperature Instability), an information processing apparatus, and a program to be executed by a computer.

2. Description of Related Art

Hot carrier and NBTI are known as phenomena which decrease the reliability of a MOSFET. The hot carrier dominantly influences characteristic degradation of an NMOSFET, and the NBTI dominantly influences characteristic degradation of a PMOSFET. The influence by these phenomena appears in the relationship between a decrease in drain current flowing between a source electrode and a drain electrode by injection of charge into gate oxide, and voltage application time.

When high voltage is applied to drain voltage Vds and the intermediate potential of Vds is applied to gate voltage Vgs, the influence of hot carrier to the NMOSFET become larger as gate length Lg becomes shorter. When high voltage is applied to Vgs, NBTI on the PMOSFET occurs at any Vds and with any Lg. It is also said that these phenomena are influenced by back bias voltage Vbs. The back bias voltage is voltage applied to a substrate on which a transistor is formed. If the transistor is formed in a well diffusion layer, the back bias voltage is voltage applied to the well diffusion layer.

Drain current is used as a value for evaluating transistor degradation. Drain current Ids is measured under the conditions of Vgs=Vcc and Vds=Vcc/2. The rate of change in the drain current is defined by a formula of $\Delta Ids/Ids0 = (Ids$ (initial state)$-Ids$ (after degradation)$)/Ids$ (initial state). Ids0 indicates Ids in the initial state at the time when voltage application starts. Transistor lifetime $\tau$ is defined as time required until $\Delta Ids/Ids0=10\%$ is satisfied after start of voltage application. It is assumed that 10% is a reference degradation rate.

FIG. 1 shows an example of a graph for determining the lifetime of a transistor based on actual measurements. The vertical axis in FIG. 1 indicates the degradation rate and the horizontal axis indicates time. A method for measuring the characteristic shown in FIG. 1 will be described below.

Gate voltage VGS is set for one voltage selected from within a predetermined range of Vcc, and Vcc/2 is set for drain voltage VDS. Drain current ID is measured at predetermined time intervals. In FIG. 1, values obtained by dividing the amount of change in the drain current by the drain current at the time of start of voltage application are plotted, and the plotted points are connected by a line. Similarly, measurement is performed for each of multiple kinds of Vcc's in a similar manner. The graph shown in FIG. 1 is obtained by plotting measurement points for each selected Vcc and connecting the plotted points.

In the graph shown in FIG. 1, attention is paid to the measurement condition of Vgs=Vgs1, and the time when the degradation rate is 10% is indicated by an arrow. In this way, the transistor lifetime $\tau$ is determined based upon actually measured data. By applying the result to the formula of Deg=f (Vgs, Vds, Lg, t), a degradation model parameter is determined.

FIGS. 2A and 2B are graphs showing transistor characteristics obtained from the measurement result in FIG. 1. FIG. 2A shows the relationship between the transistor lifetime and the reciprocal of the drain voltage, and FIG. 2B shows the relationship between the transistor lifetime and the gate voltage.

As shown in FIG. 2A, the relationship between the transistor lifetime $\tau$ and the reciprocal of the drain voltage (1/Vds) is shown as a straight line rising from left to right. From this graph, it is seen that the transistor lifetime $\tau$ becomes longer as 1/Vds becomes larger, and the transistor lifetime $\tau$ becomes shorter as Vds becomes larger. By determining the value of Vds from this straight line, it is possible to estimate $\tau$ at that time.

In the graph shown in FIG. 2B, a quartic function is obtained by plotting $\tau$ for each Vgs and connecting the plotted points. As shown in the graph in FIG. 2B, it is possible to model the transistor degradation phenomena based on the measurement result in FIG. 1.

Since it is possible to estimate transistor degradation from the measurement result in FIG. 1, reliability simulation is performed in which the measurement result is inputted to a computer to estimate the transistor degradation phenomena and predict a circuit operation.

The reliability simulation will be simply described. The reliability simulation includes degradation simulation for estimating the degradation of the lifetime of a transistor during the time when the transistor is being used, and circuit simulation for predicting a circuit operation using the result of the degradation simulation.

First, by performing degradation simulation for substituting a degradation model parameter that is determined based on the measurement result, into the degradation model formula, device degradation information during the time when the transistor is being used, is outputted. Next, by adding a stress I-V model parameter to the device degradation information and by performing circuit simulation using a transistor model parameter after degradation, a circuit waveform after degradation is obtained. An example of these simulations is disclosed in Japanese Patent Laid-Open No. 2003-188184.

The transistor model parameter is based on a particular transistor model, such as BSIM, which is required for ordinary circuit simulation. BSIM is a transistor model developed at a university in U.S., and it is widely utilized as a standard model.

An example of device degradation information outputted from degradation simulation will be described. FIG. 3 is a graph showing an example of measurements of the drain current of the transistor and a simulation result.

In the graph in FIG. 3, an initial state, a 50%-degradation state and an 80%-degradation state are shown, in terms of the Ids-Vds dependence. The plotted points in the graph indicate measurement results, and the lines drawn along the plotted points indicate simulation values. From FIG. 3, it is seen that the measurement values and the simulation values almost agree with each other, and that the evaluation target transistor is compatible with the degradation model formula of the simulation.

However, as the gate length of transistors becomes shorter in response to the demand for further miniaturization of semiconductor integrated circuits, the degradation phenomena of the transistors gradually become incompatible with the degradation model formulas of the existing degradation lifetime simulations. If the degradation phenomena of a transistor do not match a degradation model formula, the result of the simulation will not correspond to actual electrical characteristics.

For example, in the case of a model in which the degradation model formula is such that the τ-Vgs dependence is applied to a quartic function, the degradation model formula is compatible with a transistor that shows the τ-Vgs dependence of the graph in FIG. 2B. However, the degradation model formula is not compatible with a transistor that shows τ-Vgs dependence that is different from a quartic function, such as a quintic function, a sextic function and the like.

Even in the case of a model obtained by adapting a particular transistor model, such as BSIM, to be compatible with all of various kinds of transistors, since a degradation model formula and the particular transistor model are closely associated with each other in the existing degradation lifetime simulation, the existing degradation lifetime simulation is limited to transistors compatible with the degradation model formula, and it is difficult for the existing degradation lifetime simulation to be compatible with transistors that are incompatible with the degradation formula.

SUMMARY

In one embodiment, there is provided a simulation method that includes determining a relationship between stress time and a degradation rate of drain current on a basis of a table in which data of a lifetime of a transistor, or the degradation rate of the transistor, is written, and calculating an amount of change in drain current accordance with the degradation rate, using a table in which information indicating a change in the drain current, being dependent on voltage, is written, based on actually measured data of drain current of the transistor after degradation, drain current in an initial state of a particular transistor model, and the relationship between stress time and the degradation rate of drain current.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The configuration of an information processing apparatus which executes the simulation method of this exemplary embodiment will be described.

Figure 1:
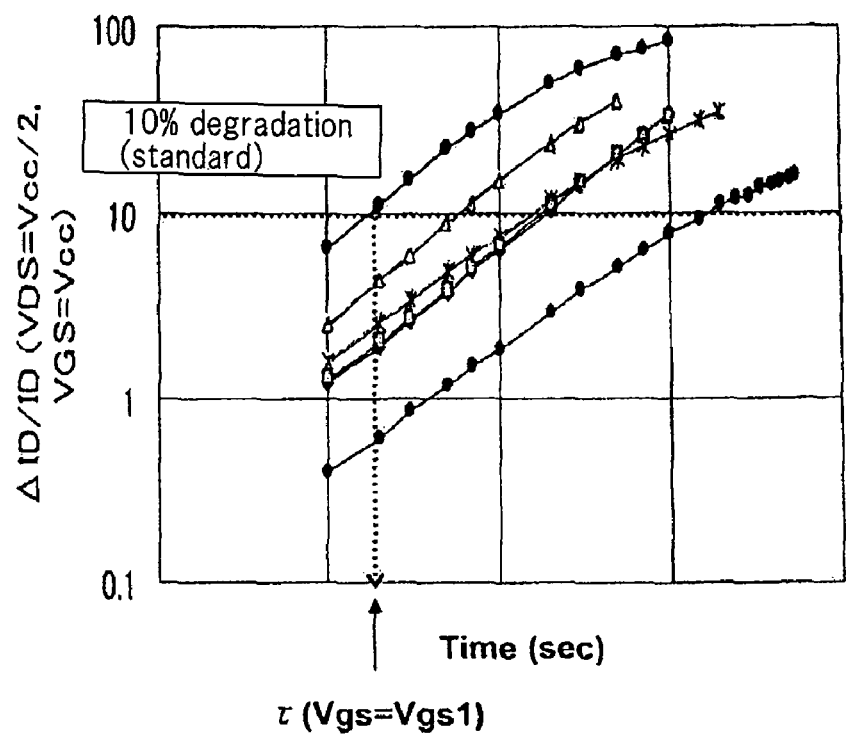
FIG. 1 shows an example of a graph for determining the lifetime of a transistor from actual measurements.
Figure 2A:
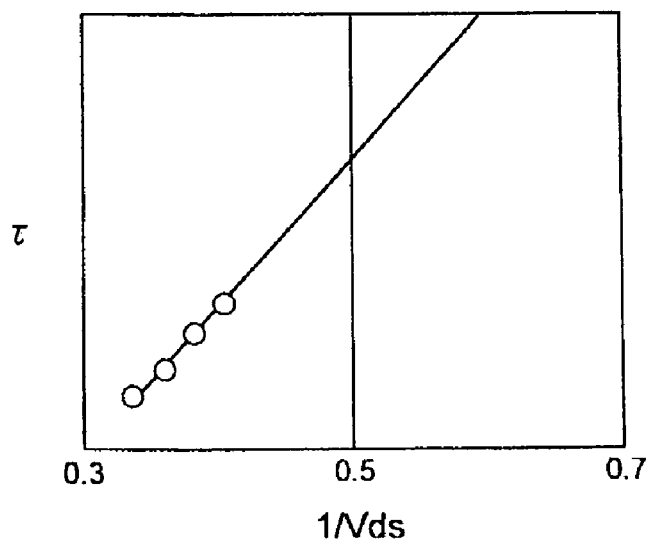
FIGS. 2A and 2B are graphs showing transistor characteristics obtained from the measurement result in FIG. 1.
Figure 2B:
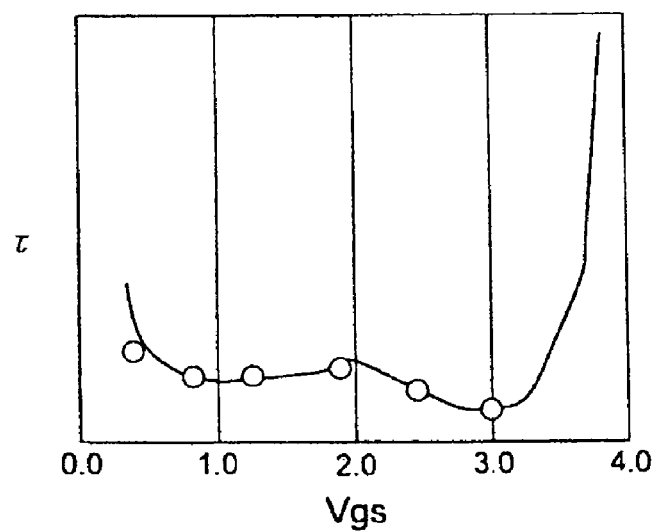
Figure 3:
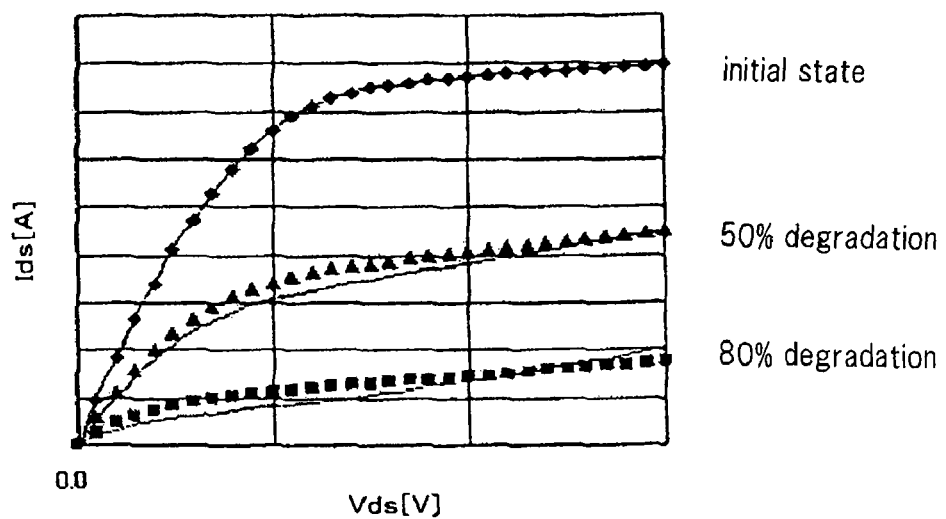
FIG. 3 is a graph showing an example of measurements of the drain current of the transistor and a simulation result.
Figure 4:
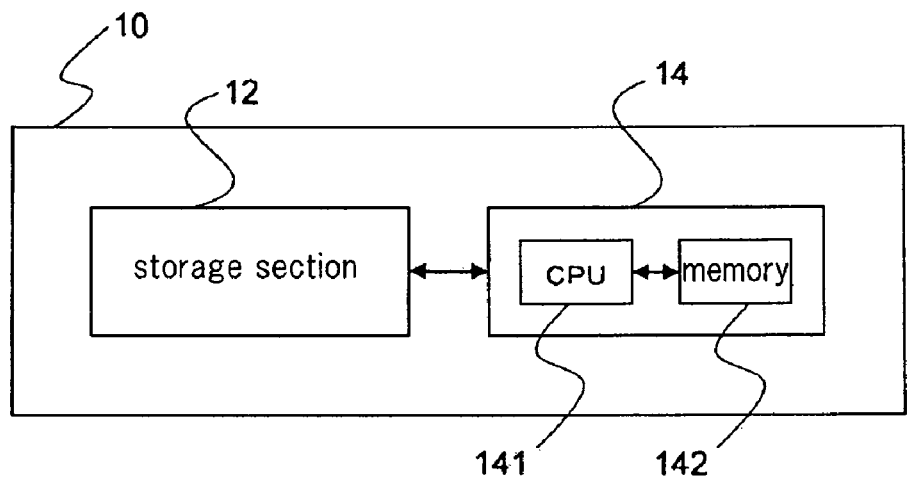
FIG. 4 is a block diagram showing a configuration example of an information processing apparatus for executing a simulation method of this exemplary embodiment.

FIG. 4 is a block diagram showing a configuration example of the information processing apparatus for executing the simulation method of this exemplary embodiment. The information processing apparatus is a computer such as a personal computer and a workstation.

As shown in FIG. 4, information processing apparatus 10 of this exemplary embodiment includes storage section 12 and control section 14. In storage section 12, there is stored a program for a particular transistor model represented by BSIM. Control section 14 includes CPU (Central Processing Unit) 141 which executes processing in accordance with the program and memory 142 for storing the program.

Control section 14 determines a relationship between stress time and degradation rate on the basis of a table in which data of the lifetime of an evaluation target transistor at a reference graduation rate, that lifetime being dependent on voltage, is written for three kinds of voltages, that is, gate voltage, drain voltage and back bias voltage, or on the basis of a table in which data of the degradation rate of a drain current of the evaluation target transistor during a reference time, that degradation rate being dependent on voltage, is written for the above three kinds of voltages. Then, on the basis of actually measured data, at a reference degradation, of the drain current of the evaluation target transistor after degradation according to the stress time, on the drain current in the initial state of a particular transistor model, and on the above-described relationship, control section 14 creates a table in which information that indicates a change in the drain current, that information being dependent on voltage, is written for the above three kinds of voltages. With reference to the table created in this way, the amount of change in the drain current is calculated according to the degradation rate.

Control section 14 may create a τ-Vgs, Vds table indicating τ dependent on Vgs and Vds on the basis of a τ-Vgs dependence table for the evaluation target transistor. In this case, a conversion formula for converting the τ-Vgs dependence table to the τ-Vds dependence table is written in the above program.

Figure 5:
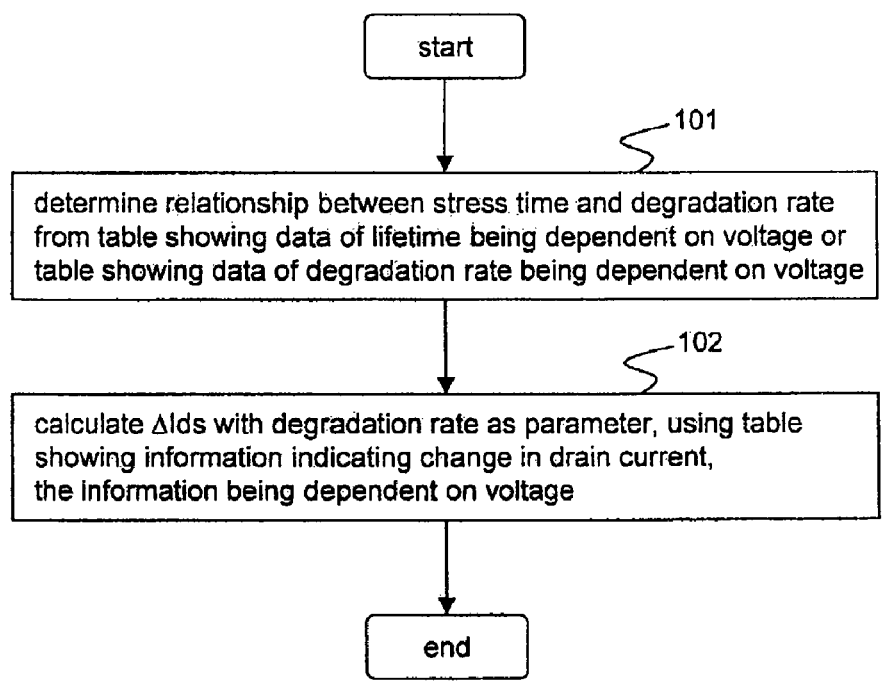
FIG. 5 is a flowchart showing a procedure for the simulation method of this exemplary embodiment.

Next, the simulation method to be executed by the information processing apparatus shown in FIG. 4 will be described. FIG. 5 is a flowchart showing a procedure for the simulation method of this exemplary embodiment.

First, the relationship between the stress voltage and the transistor lifetime τ will be determined as described below (step 101).

Data of τ-Vgs dependence is determined from actually measured data, and the measured data is converted to a table. To convert actually measured data or data calculated on the basis of the actually measured data to a table will be referred to as "table modeling". Similarly, table modeling concerning each of the τ-Vds dependence and the τ-Vbs dependence is also performed.

When table modeling of the τ-Vds dependence is performed, the table modeling may be performed with the use of actually measured data, similarly to the case of τ-Vgs dependence. However, the τ-Vgs dependence table may be obtained by converting the τ-Vgs dependence table to a τ-Vgs, Vds dependence table based on a predetermined function formula, as described below.

Figure 6:
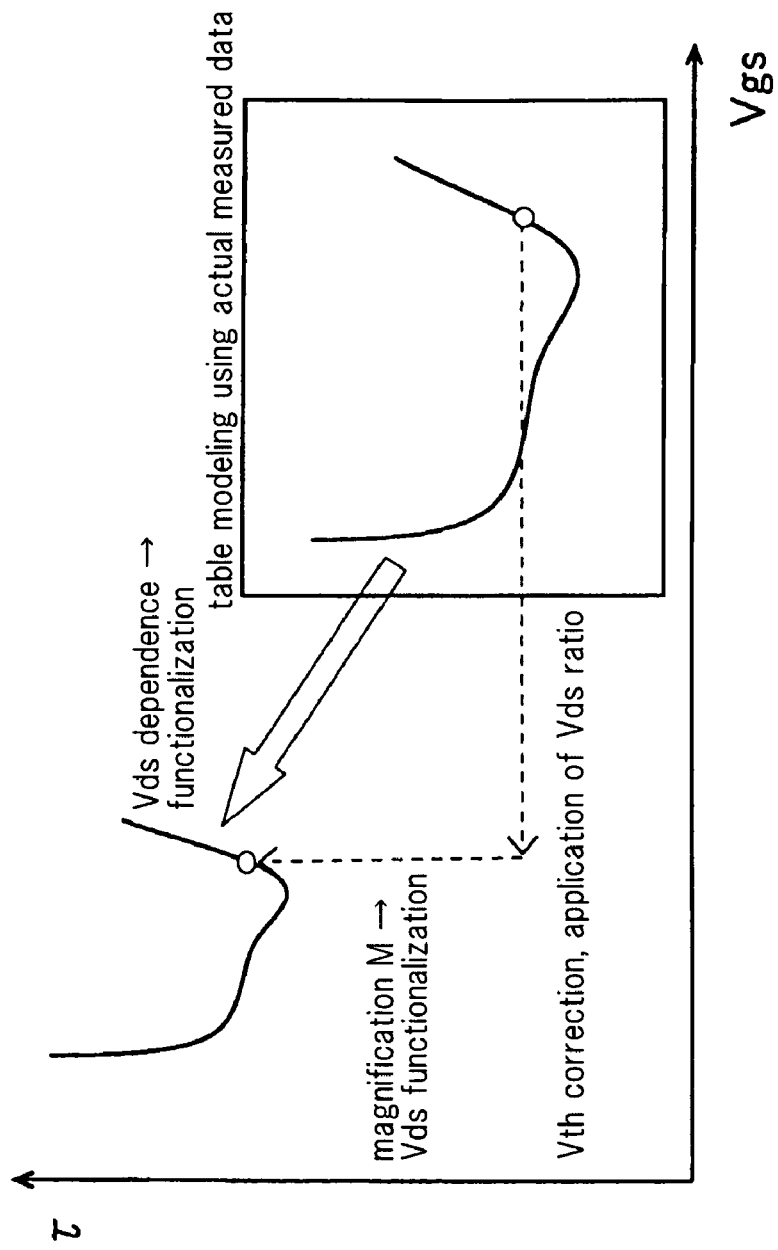
FIG. 6 is a diagram for illustrating an example of a method for determining a τ-Vgs, Vds dependence table from a τ-Vgs dependence table.

FIG. 6 is a diagram for illustrating an example of a method for determining the τ-Vgs, Vds dependence table from the τ-Vgs dependence table.

In general, in a MOSFET, the carrier density of an active region is controlled by the gate voltage, and the amount of the carrier flowing between the source electrode and the drain electrode is controlled by the drain voltage. Therefore, both voltages are involved in the drain current, and the τ-Vgs dependence and the τ-Vds dependence are correlative to each other. From this correlation, the τ-Vds dependence table is determined from the τ-Vgs dependence table, for example, as described below.

The τ-Vgs dependence table based on actually measured data is determined by the drain voltage Vds=(constant value). Therefore, it is necessary to determine the values of the Vgs that take the Vds dependence into consideration. If the gate voltage of the τ-Vgs dependence table is denoted by the Vgs_table, the drain voltage of the τ-Vds dependence table is denoted by the Vds_table, a threshold voltage Vth is denoted by Vth0, and an arbitrary parameter is denoted by F, then the relationship between the range of the drain voltage Vds and Vgs which takes drain voltage dependence into consideration can be indicated by Formula (1).

$$Vgs = ((Vgs\_table - Vth0) \times F \times Vds/Vds\_table) + Vth0 \quad \text{Formula (1)}$$

However, depending on the kind of the evaluation target transistor, the gate voltage may not be influenced by a change in the drain voltage. In such a case, if the parameter F=0 is set, Formula (1) results in Vgs=Vth0. Therefore, Vgs=Vgs_table is used instead of Formula (1). If τ of the τ-Vgs dependence is set as τ_table and the arbitrary parameter is set as A, then τ which takes the Vds dependence into consideration is determined by the following formula:

$$\tau = \tau\_table \times M = \tau\_table \times EXP\{A \times (1/Vds - 1/Vds\_table)\} \quad \text{Formula (2)}$$

In the above processing, the τ-Vds dependence table is determined by applying a Vds ratio corresponding to the range of Vds in the τ-Vds dependence table to values obtained by correcting Vgs in the τ-Vgs dependence table according to threshold voltage Vth and multiplying τ by magnification M. In this way, it is possible to perform functionalization for determining the τ-Vds dependence on the basis of the τ-Vgs dependence. Formulas (1) and (2) have been generated by the inventor during the process of completing the present invention.

Whether or not to perform Vth correction for Vgs, and magnification M depend on the kind of transistor. Therefore, it is desirable not to apply one relationship to all transistors but to convert τ-Vds dependence data to a table according to transistors. In this case, the range of transistors applicable as an evaluation target is widened in comparison with the case where evaluation target transistors are limited by a degradation model formula.

The transistor lifetime τ is modeled by the following formula:

$$\tau = f(Vds, Vgs) \times f(Lg) \times f(Vbs) \quad \text{Formula (3)}$$

f(Vds, Vgs) in Formula (3) is a term about "the relationship between stress volume and τ" determined at step 101. The τ-Vgs dependence table and the τ-Vds dependence table are applied to this term. The term f(Lg)×f(Vbs) is a term which can be functionalized. The term f(Lg) is a term about the gate length Lg, and, for example, f(Lg)=exp(−G/Lg) is known. G is a constant. The term f(Vbs) is a term about the dependence of the back bias volume Vbs, and the τ-Vbs dependence table is applied. Thereby, a table is created in which data, of the lifetime of a transistor at a reference degradation rate of the drain current, that lifetime being dependent on voltage, is written for the three kinds of voltages, that is, the gate voltage, the drain voltage and the back bias voltage. The transistor lifetime τ in Formula (3) is inserted into the next Formula (4).

$$Deg = Deg_F \left(\frac{t}{\tau}\right)^n \quad \text{Formula (4)}$$

In Formula (4), t denotes stress time, and $Deg_F$ denotes a reference degradation degree (the degradation degree is 0.1 because the degradation rate is 10%) at which the transistor lifetime τ is defined. From Formula (4), a degradation rate Deg during an arbitrary stress time t is determined. Furthermore, n is a coefficient dependent not on the stress level but on the process, and it is determined from an actual measurement result.

In this exemplary embodiment, there has been explained a case of creating a table in which data, of the lifetime of a transistor at a reference degradation rate of the drain current, that lifetime being dependent on voltage, is written for the three kinds of voltages, that is, gate voltage, drain voltage and back bias voltage, and determining a relationship between stress time and degradation rate using the created three kinds of tables, as described above. However, a table may be used in which data of a degradation rate of a transistor during a reference time, that degradation rate being dependent on voltage, is written. The reference time is, for example, ten years.

Figure 7A:
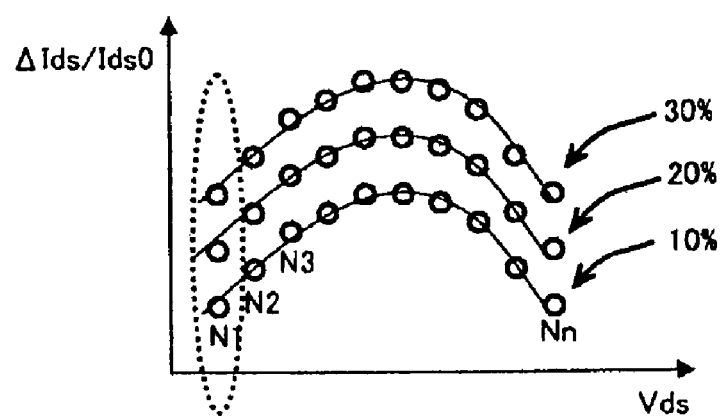
FIGS. 7A and 7B are diagrams for illustrating a method for determining a degradation I-V characteristic.
Figure 7B:
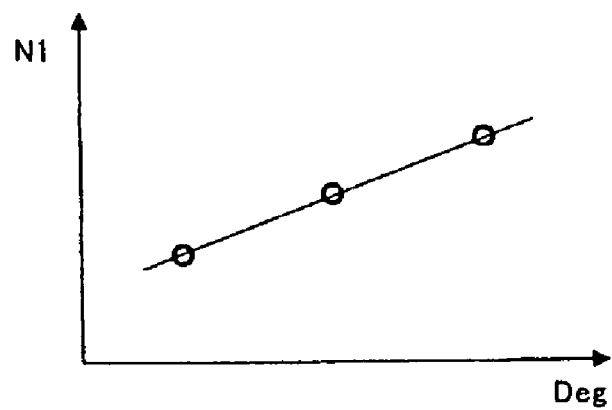

Next, the degradation I-V characteristic is determined as described below (step 102). FIGS. 7A and 7B are diagrams for illustrating a method for determining the degradation I-V characteristic. Drain current Ids at any time of degradation of the transistor can be indicated by the following Formula:

$$Ids = TrModel(Vds, Vgs, Vbs, \text{etc.}) + \alpha \quad \text{Formula (5)}$$

TrModel in Formula (5) denotes a particular transistor model. The particular transistor model is, for example, BSIM. As shown in Formula (5), the drain current Ids at any time of degradation of the transistor corresponds to what is obtained by adding a term indicating the amount of degradation α to the drain current in the initial state of the particular transistor model. Formula (5) can be shown as Ids=Ids0+α.

According to this method, only addition of the amount of degradation α to an initial characteristic based on a transistor model which can be widely applied is performed. Therefore, the range of transistors applicable as an evaluation target is widened in comparison with the case of closely associating a degradation model formula and a particular transistor model with each other.

FIG. 7A is a graph showing the relationship between the degradation rate and drain voltage, and FIG. 7B is a graph for performing functionalization.

The amount of degradation α in Formula (3) corresponds to ΔIds in FIG. 7A. As shown in FIG. 7A, the change rate (=the amount of change (ΔIds)/initial value (Ids0))−Vds dependence at the time when the drain current degrades by 10% is measured. Points N1 to Nn (n: an arbitrary natural number) shown in FIG. 7A are actually measured data. If Formula (4) is applied to this actually measured data and functionalization is performed, it can be expressed as α=fdeg·(Vds, Vgs, Vbs, Deg, etc.)

It is also possible to perform table modeling of N1 to Nn at the time when the drain current degrades by 10%. Since functionalization has been performed, points among actually measured data can also be calculated. The calculated data may be added to the table.

Next, paying attention to N1 in the graph of FIG. 7A, a value in each of the cases of DEG=20% and DEG=30% is determined in the formula of α=fdeg·(Vds, Vgs, Vbs, Deg, etc.). FIG. 7B is obtained by plotting the values as a graph. The vertical axis in FIG. 7B indicates ΔIds/Ids0 of N1, and the horizontal axis indicates the degradation rate. Since the degradation rate is related to the lifetime of the transistor, the horizontal axis may indicate the lifetime (Age).

By determining the formula of the straight line connecting the plotted points in FIG. 7B, it is possible to functionalize the ΔIds/Ids0–Deg dependence for N1 at the time when Vds is constant. This formula is assumed to be N1(Deg)=f(Deg).

Next, for each of N2, N3, ... Nn, a relationship corresponding to N1(Deg)=f(Deg) is determined, and the values in the case of 20%-degradation and 30%-degradation are determined similarly to the case of N1. By plotting all the values as a graph, the graph as in FIG. 7A is obtained.

From the relations, ΔIds=α(Deg), the amount of change in Ids for an arbitrary degradation rate, is determined. In FIGS. 7A and 7B, the values are determined in the case of Vds dependence. For the cases of Vgs dependence and Vbs dependence also, the values are determined. Thereby, a table can be created in which data, that shows that the amount of change in the drain current is dependent on the gate voltage, the drain voltage and the back bias voltage, is written.

A table may be created in which the change rate (ΔIds/Ids0) is used instead of the amount of change (ΔIds) in the drain current in the created table. In this case, by multiplying the change rate by the drain current in the initial state of a particular transistor model as Ids0, the amount of change can be calculated. Thus, when the table is created, either the amount of change in the drain current or the change rate thereof may be used as information that indicates a change in the drain current.

Thus, determination of "stress (time and voltage)→degradation rate" is performed at step 101, and determination of "degradation rate→degradation I-V characteristic" is performed at step 102. By inputting ΔIds (the amount of change), that is determined as a result, to a circuit simulator, a circuit waveform close to the operation of an actual product device can be outputted.

In this exemplary embodiment, a table model, instead of a degradation model formula fixed, is used in which actual measurement results are shown as a table, to transistor degradation simulation. Therefore, the evaluation target transistor is not limited to such a transistor which is suitable for the degradation model formula, and the range of transistors applicable as an evaluation target is widened. Furthermore, since a relationship is derived from a table model based on actually measured data according to the evaluation target transistor, a simulation result closer to the actual degradation characteristic can be obtained in comparison with the case of using a fixed degradation model formula.

It is apparent that the present invention is not limited to the above embodiments, but may be modified and changed without departing from the scope and spirit of the invention.

What is claimed is:

1. A simulation method comprising:
   determining a relationship between stress time and a degradation rate of drain current on a basis of a first table in which data of a lifetime of an evaluation target transistor, at a reference degradation rate, said lifetime being dependent on voltage, is written for three kinds of voltages, that is, gate voltage, drain voltage and back bias voltage, or on a basis of a second table in which data of said degradation rate of said drain current of said evaluation target transistor, during a reference time, said degradation rate of said drain current being dependent on voltage, is written for said three kinds of voltages; and
   calculating an amount of change in drain current in accordance with said degradation rate of said drain current, using a third table in which information indicating a change in said drain current, said information being dependent on voltage, is written for said three kinds of voltages, said third table being based on actually measured data, at said reference degradation, of drain current of said evaluation target transistor after degradation according to said stress time, drain current in an initial state of a particular transistor model and said relationship between said stress time and said degradation rate of said drain current.

2. The simulation method according to claim 1, further comprising:
   generating a fifth table in which data of said lifetime that is dependent on said drain voltage at said reference degradation rate is written, from a fourth table in which data of said lifetime that is dependent on said gate voltage at said reference degradation rate is written.

3. The simulation method according to claim 2, wherein said fifth table is generated by applying a drain voltage ratio corresponding to a range of said drain voltage in said fifth table to values obtained by correcting said gate voltage in said fourth table according to threshold voltage and multiplying said lifetime at a predetermined degradation rate in said fourth table by predetermined magnification.

4. An information processing apparatus comprising:
   a storage section storing a program for a particular transistor model; and
   a control section determining a relationship between stress time and a degradation rate of drain current on a basis of a first table in which data of a lifetime of an evaluation target transistor, at a reference degradation rate, said lifetime being dependent on voltage, is written for three kinds of voltages, that is, gate voltage, drain voltage and back bias voltage, or on a basis of a second table in which data of said degradation rate of said drain current of said evaluation target transistor, during a reference time, said degradation rate of said drain current being dependent on voltage, is written for said three kinds of voltages, and calculating an amount of change in drain current in accordance with said degradation rate of said drain current, using a third table in which information indicating a change in said drain current, said information being dependent on voltage, is written for said three kinds of voltages, said third table being based on actually measured data, at said reference degradation, of drain current of said evaluation target transistor after degradation according to said stress time, drain current in an initial state of a particular transistor model and said relationship between said stress time and said degradation rate of said drain current.

5. The information processing apparatus according to claim 4, wherein, when a fourth table in which data of said lifetime that is dependent on said gate voltage at said reference degradation rate is written, is inputted, said control section generates a fifth table in which data of said lifetime that is dependent on said drain voltage at said reference degradation rate is written, from said fourth table.

6. The information processing apparatus according to claim 5, wherein said control section generates said fifth table by applying a drain voltage ratio corresponding to a range of said drain voltage in said fifth table to values obtained by correcting said gate voltage in said fourth table according to threshold voltage and multiplying said lifetime at a predetermined degradation rate in said fourth table by predetermined magnification.

7. A storage medium in which a program for causing a computer to execute degradation phenomenon simulation of a transistor is computer-readably recorded, the program being implemented to causing the computer to execute processing of:

determining a relationship between stress time and a degradation rate of drain current on a basis of a first table in which data of a lifetime of an evaluation target transistor, at a reference degradation rate, said lifetime being dependent on voltage, is written for three kinds of voltages, that is, gate voltage, drain voltage and back bias voltage, or on a basis of a second table in which data of said degradation rate of said drain current of said evaluation target transistor, during a reference time, said degradation rate of said drain current being dependent on voltage, is written for said three kinds of voltages; and calculating an amount of change in drain current in accordance with said degradation rate of said drain current, using a third table in which information indicating a change in said drain current, said information being dependent on voltage, is written for said three kinds of voltages, said third table being based on actually measured data, at said reference degradation, of drain current of said evaluation target transistor after degradation according to said stress time, drain current in an initial state of a particular transistor model and said relationship between said stress time and said degradation rate of said drain current.

8. The storage medium according to claim 7, wherein a program is recorded which includes processing of, when a fourth table in which data of said lifetime that is dependent on said gate voltage at said reference degradation rate is written, is inputted, generating a fifth table in which data of said lifetime that is dependent on said drain voltage at said reference degradation rate is written, from said fourth table.

9. The storage medium according to claim 8, wherein a program is recorded which includes processing of generating said fifth table by applying a drain voltage ratio corresponding to a range of said drain voltage in said fifth table to values obtained by correcting said gate voltage in said fourth table according to threshold voltage and multiplying said lifetime at a predetermined degradation rate in said fourth table by predetermined magnification.

* * * * *